(12) United States Patent
Chen et al.

(10) Patent No.: US 11,600,559 B2
(45) Date of Patent: Mar. 7, 2023

(54) SENSOR DEVICE AND METHOD OF MANUFACTURE

(71) Applicant: Melexis Technologies NV, Tessenderlo (BE)

(72) Inventors: Jian Chen, Heist-op-den-Berg (BE); Appolonius Jacobus Van Der Wiel, Duisburg (BE); Laurent Otte, Brussels (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 211 days.

(21) Appl. No.: 16/557,224

(22) Filed: Aug. 30, 2019

(65) Prior Publication Data

US 2020/0075466 A1 Mar. 5, 2020

(30) Foreign Application Priority Data

Aug. 31, 2018 (EP) .................................... 18192054

(51) Int. Cl.
*H01L 23/00* (2006.01)
*H01L 23/13* (2006.01)
(Continued)

(52) U.S. Cl.
CPC ...... *H01L 23/49575* (2013.01); *G01L 9/0045* (2013.01); *G01L 19/0076* (2013.01); *H01L 21/56* (2013.01); *H01L 23/13* (2013.01); *H01L 23/49541* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01);
(Continued)

(58) Field of Classification Search
None
See application file for complete search history.

(56) References Cited

U.S. PATENT DOCUMENTS 5,115,292 A * 5/1992 Takebe ................ G01P 15/0802
257/254
2004/0189292 A1* 9/2004 Kautz .................... G01R 33/02
324/202

(Continued)

FOREIGN PATENT DOCUMENTS

DE 102014006037 A1 * 10/2014 ........... B81B 7/0077

OTHER PUBLICATIONS

European Search Report for European Patent Application No. 18192054 dated Feb. 21, 2019.

*Primary Examiner* — Michelle Mandala
*Assistant Examiner* — Jordan M Klein
(74) *Attorney, Agent, or Firm* — Harness, Dickey & Pierce, P.L.C.

(57) ABSTRACT

A method of manufacturing a sensor device (100) comprises providing (200) a package (102) having a first die-receiving subframe volume (104) separated from a second die-receiving subframe volume (106) by a partition wall (116). An elongate sensor element (120) is disposed (202) within the package (102) so as to bridge the first and second subframe volumes (104, 106) and to overlie the partition wall (116). The elongate sensor element (120) resides substantially in the first subframe volume (104) and partially in the second subframe volume (106). The elongate sensor element (120) is electrically connected within the second subframe volume (106).

18 Claims, 4 Drawing Sheets

(51) Int. Cl.
*G01L 9/00* (2006.01)
*G01L 19/00* (2006.01)
*H01L 21/56* (2006.01)
*H01L 23/495* (2006.01)

(52) U.S. Cl.
CPC ............... *H01L 2224/32245* (2013.01); *H01L 2224/48091* (2013.01); *H01L 2224/48101* (2013.01); *H01L 2224/48137* (2013.01); *H01L 2224/73265* (2013.01); *H01L 2224/92247* (2013.01); *H01L 2924/1426* (2013.01)

(56) References Cited

U.S. PATENT DOCUMENTS

| | | | |
|---|---|---|---|
| 2005/0284216 A1* | 12/2005 | Tanaka | G01F 1/692 73/204.26 |
| 2009/0102033 A1 | 4/2009 | Raben | |
| 2011/0296904 A1* | 12/2011 | Tagawa | G01F 1/6842 73/114.32 |
| 2014/0360262 A1 | 12/2014 | Asano et al. | |
| 2017/0089796 A1 | 3/2017 | Ihle et al. | |

\* cited by examiner

SENSOR DEVICE AND METHOD OF MANUFACTURE

FIELD

The present invention relates to a sensor device of the type that, for example, comprises a sensor element and a circuit disposed within a package. The present invention also relates to a method of manufacturing a sensor device, the method being of the type that, for example, provides a sensor element and a circuit in a package.

BACKGROUND

In the field of semiconductor sensor devices, it is known to dispose a pressure sensor element within a cavity of a pre-moulded lead frame package. The sensor element is attached within the cavity and electrically connected by bond wires to connecting pads located on an internal surface of the lead frame package. To contain the pressure sensor element securely within the lead frame package, an overmoulding technique is employed that exposes side surfaces of the sensor element to a mould compound. However, the high stiffness and high thermal expansion of the mould compound results in the packaging applying a great deal of stress to the sensing element when the part cools down after curing the mould compound. Furthermore, it is known for the stress to change over time, thereby causing an output signal generated by the sensor element to drift by more than 2% of the full scale output of the sensor element.

In some implementations, chemical protection is provided by a gel that envelops the pressure sensor element. The gel can also partially or completely overlie the bond wires, the connecting pads and an integrated circuit. However, the resistance of the packaged sensor device to harsh media is defined by the physical properties of the gel. Also, the gel adds an offset to the pressure sensed by the pressure sensor element and creates a g-force when the pressure sensor is exposed to acceleration, which can be an important influence on measurements made in automotive applications. Furthermore, all metals in the cavity, for example bond pads of the pressure sensor element, fingers of the leadframe, and bond-wires, have to be noble. The processing, and the resulting packaged device, is therefore complicated and relatively expensive.

US patent publication no. 2009/0102033 describes a package for an integrated circuit, the package comprising a housing providing a pair of parallel surfaces, and a lead frame for carrying the integrated circuit. The package comprises a through-hole in two surfaces and employs the overmoulding technique mentioned above. However, this package is poorly compatible with incorporation of a pressure sensor element therein, where the pressure sensor element has a pressure sensor port.

SUMMARY

According to a first aspect of the present invention, there is provided a method of manufacturing a sensor device, the method comprising: providing a package having a first die-receiving subframe volume separated from a second die-receiving subframe volume by a partition wall; disposing an elongate sensor element within the package so as to extend from the first subframe volume into the partition wall, the elongate sensor element residing substantially in the first subframe volume; and filling the second subframe volume with an encapsulant material.

The method may further comprise: disposing the elongate sensor element so as to bridge the first and second subframe volumes, thereby extending through the partition wall so as to reside partially in the second subframe volume.

The method may further comprise: providing a sensing region at a first end of the elongate sensor element and an electrical contact at a second end of the elongate sensor element.

The second end of the elongate sensor element may extend sufficiently into the second subframe volume so that at least part of the electrical contact is accessible for connection within the second subframe volume, for example wire bonding.

The method may further comprise: disposing a circuit in the second subframe volume.

The circuit may be an integrated circuit. The circuit may be fixedly sited in the second subframe volume, for example by adhesion. The elongate sensor element may be fixedly coupled to the partition wall, for example by adhesion.

The method may further comprise: electrically coupling the circuit to the elongate sensor element.

The method may further comprise: wire bonding with respect to the circuit and the elongate sensor element.

The package may comprise an internal lead contact terminal, and the circuit may be a driver integrated circuit; and the method may further comprise: wire bonding the driver integrated circuit to the elongate sensor element and to the internal lead contact terminal of the package.

The method may further comprise: electrically connecting the elongate sensor element within the second subframe volume.

The second end of the elongate sensor element may protrude into the second subframe volume; and the method may further comprise: enveloping the second end of the elongate sensor element with the encapsulant material.

The encapsulant material may be an epoxy material. The encapsulant material may be a high viscosity material. The method may further comprise forming a glob top with the encapsulant material.

The elongate sensor element may comprise a membrane; the membrane may be located in the first subframe volume.

The method may further comprise: providing the first and second subframe volumes as first and second cavities, respectively.

The first cavity may be formed as substantially a first hyperrectangle. The second cavity may be formed as substantially a second hyperrectangle.

The method may further comprise: providing the first and second cavities in stepped relation with respect to each other.

The method may further comprise: forming the first and second cavities so that the first cavity is deeper than the second cavity.

The elongate sensor element may comprise an upper surface and a lower surface; and the method may further comprise: providing the second subframe volume as a cavity; and configuring the first subframe volume so that the upper and lower surfaces of the elongate sensor element are exposed to ambient.

The method may further comprise: forming the elongate sensor element as a pressure sensor.

According to a second aspect of the invention, there is provided a sensor device comprising: a package having a first die-receiving subframe volume separated from a second die-receiving subframe volume by a partition wall; an elongate sensor element disposed within the package so as to extend from the first subframe volume into the partition wall, the elongate sensor element residing substantially in the first subframe volume; wherein the elongate sensor element is enveloped with an encapsulant material.

It is thus possible to provide a sensor device and a method of manufacturing a sensor device that employs fewer moulding steps than known sensor packaging techniques. In this respect, a second and any subsequent moulding steps are not required, thereby simplifying the manufacture of the sensor device and the cost of production thereof. The method of manufacture is also flexible in terms of applicability to packaging different elements requiring physical protection. Furthermore, the device and method does not require the provision of the functionally disadvantageous parallel surfaces and a through-hole.

BRIEF DESCRIPTION OF THE DRAWINGS

At least one embodiment of the invention will now be described, by way of example only, with reference to the accompanying drawings, in which.

DETAILED DESCRIPTION OF THE EXAMPLE EMBODIMENTS

Figure 1:
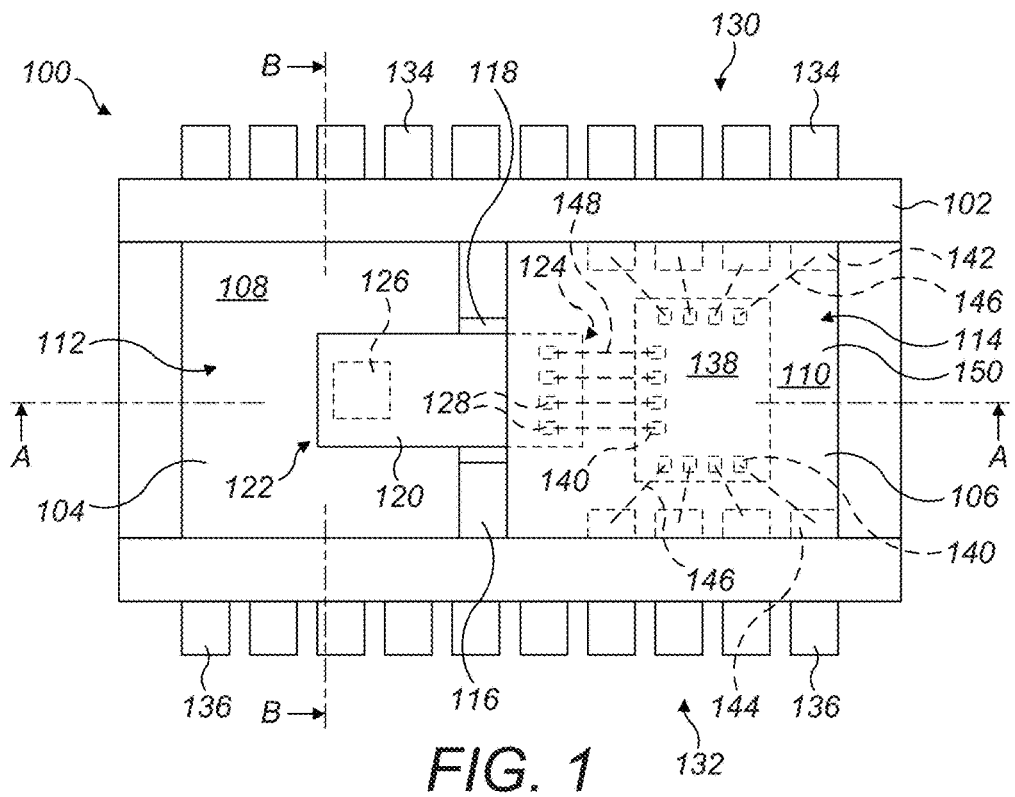
FIG. 1 is a schematic plan view of a pressure sensor device constituting an embodiment of the invention.

Throughout the following description, identical reference numerals will be used to identify like parts.

Referring to FIG. 1, a sensor device, for example a pressure sensor device 100, comprises a lead frame package 102. It should, however, be appreciated that any suitable package can be employed, for example a frame package or a lead frame-based package. Other packages can be employed, for example ceramic packages or laminate packages or indeed any package or structure that can support at least two cavities therein. The lead frame package 102 comprises a first die-receiving subframe 104 and a second die-receiving subframe 106. In this example, the first die-receiving subframe 104 comprises a first base 108 and the second die-receiving subframe 106 comprises a second base 110. Consequently, the first die-receiving subframe 106 provides a first cavity 112 and the second die-receiving subframe 106 provides a second cavity 114. The first die-receiving subframe 104 and the second die-receiving subframe 106 are separated by a partition wall 116. The partition wall 116 comprises, in this example, a generally central cut-out 118.

Although not discernible from FIG. 1, the first cavity 112 is deeper than the second cavity 114. As such, the first cavity 112 is disposed in stepped relation to the second cavity 114. It therefore follows that the volume of the first die-receiving subframe 104 is disposed in stepped relation to the volume of the second die-receiving subframe 106.

A sensor element, for example a generally elongate sensor element, such as a pressure sensor element 120, is disposed in the lead frame package 102. In this example, the pressure sensor element is a piezoresistive type of sensor comprising a sensing membrane 126 formed, for example, from silicon, which is sensitive to external mechanical stress. The pressure sensor element 120 comprises a first end 122 and a second end 124, the pressure sensor element 120 comprising the membrane 126 at the first end 122 thereof to support a sensing region of the sensor element, and one or more first electrical contacts 128, for example bond pads, at the second end 124 thereof. The membrane 126 resides in the first cavity 112. The pressure sensor element 120 bridges the volume of the first and second die-receiving subframes 104, 106. The pressure sensor element 120 substantially resides in the first cavity 112, i.e. the majority of the pressure sensor element 120 resides in the first cavity 112, but extends across the partition wall 116, through the cut-out 118, and protrudes into the second cavity 114. In this respect, the second end 124 of the pressure sensor element 120 extends sufficiently into the second cavity 114 such that the first electrical contacts 128 of the pressure sensor element 120 reside in the second cavity 114. In this example, the second end 124 of the pressure sensor element 120 extends sufficiently into the second cavity 114 so at least part of the first electrical contacts 128 are accessible for connection within the second cavity 114.

The lead frame package 102 is, in this example, pre-moulded, and generally elongate in shape, such as rectangular in shape. The lead frame package 102 comprises a first lateral side 130 and a second lateral side 132 that respectively carry a first plurality of pins 134 of a lead frame and a second plurality of pins 136 of the lead frame. The volume of the first die-receiving subframe 104 is, in this example, generally hyperrectangular in form. Similarly, the volume of the second die-receiving subframe 106 is, in this example, generally hyperrectangular in form.

In addition to the pressure sensor element 120, a die, for example a circuit, is disposed in the second die-receiving subframe 106. The circuit is, in this example an Integrated Circuit (IC), such as a driver or signal conditioning IC 138. The driver IC 138 comprises one or more second electrical contacts 140, for example second bond pads. In this example, some of the second bond pads 140 of the driver IC 138 are connected to first and second inner lead contact terminals 142, 144 of the first plurality of pins 134 and the second plurality of pins 136 of the lead frame, respectively, by first bond wires 146. Some of the second bond pads 140 are coupled to the first bond pads 128 of the pressure sensor element 120 by second bond wires 148. The skilled person should appreciate, though, that the above-described connectivity has been described for exemplary purposes only and other connection configurations are entirely conceivable depending upon the design of the sensor element 126 and/or the design of the circuit 138, as well as the configuration of the lead frame of the lead frame package 102. However, it should be appreciated that at least some connections are made between the circuit 138 to the lead frame 144, 146 and/or the sensor element 126 within the second cavity 114.

The contents of the second cavity 114, for example the circuit 138, the second end 124 of the pressure sensor element 120 carrying the bond pads 128 and the first and second inner lead contact terminals 142, 144, are potted or enveloped in an encapsulant material 150, for example an epoxy material, which can be hash media resistant. The encapsulant material 150 is dispensed onto a target area to be encapsulated, as opposed to for example transfer moulded, and fills the second cavity 114. The encapsulant material 150 is also, in this example, a high viscosity material. More specifically, in this example, a glob top is applied to fill the second subframe volume or cavity 110.

Figure 2:
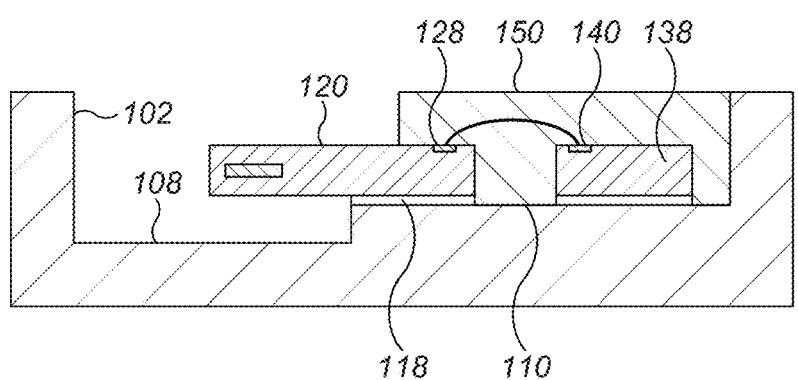
FIG. 2 is a schematic cross section along line A-A of the pressure sensor device of FIG. 1.

Turning to FIG. 2, the relative locations of the first base 108 and the second base 110 of the lead frame package 102 being in stepped relation can be more clearly seen in the cross section along line A-A. The pressure sensor element 120 extends from the first cavity 112 over cut-out 118 in the partition wall 116 and into the second cavity 114. The majority of the pressure sensor element 120 is therefore suspended in the first cavity 112, for example cantilever-suspended from the partition wall 116.

Figure 3:
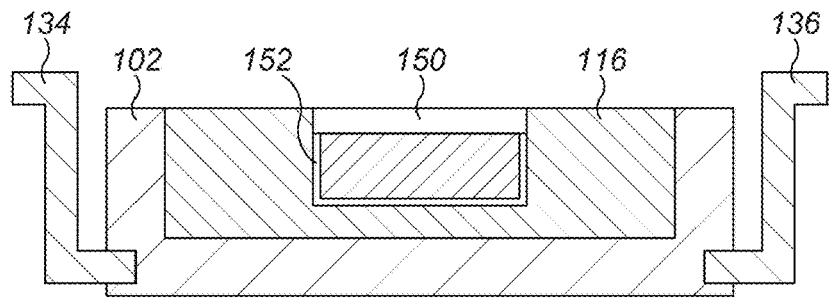
FIG. 3 is a schematic cross section along line B-B of the pressure sensor device of FIG. 1.

Referring additionally to FIG. 3, the pressure sensor element 120 is secured in the cut-out 118 of the partition wall 116 by, for example, an adhesive. Similarly, the driver IC 138 is secured to the second base 110 by, for example, an adhesive. In this example, the cut-out 118 is wider than the pressure sensor element 120 by a margin, for example about ±50 µm, but in any event that supports a placement accuracy of a tool that places the pressure sensor element 120 in the cut-out 118, and so there is a lateral clearance 152 to the sides of the pressure sensor element 120 in the cut-out 118.

Figure 4:
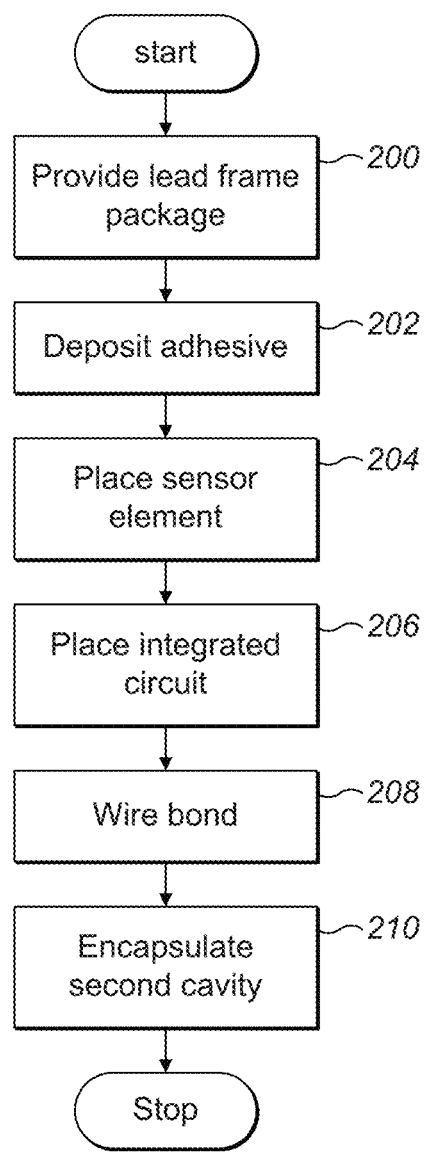
FIG. 4 a flow diagram of a method of manufacture of the pressure sensor device of FIG. 1 constituting another embodiment of the invention.
Figure 5:
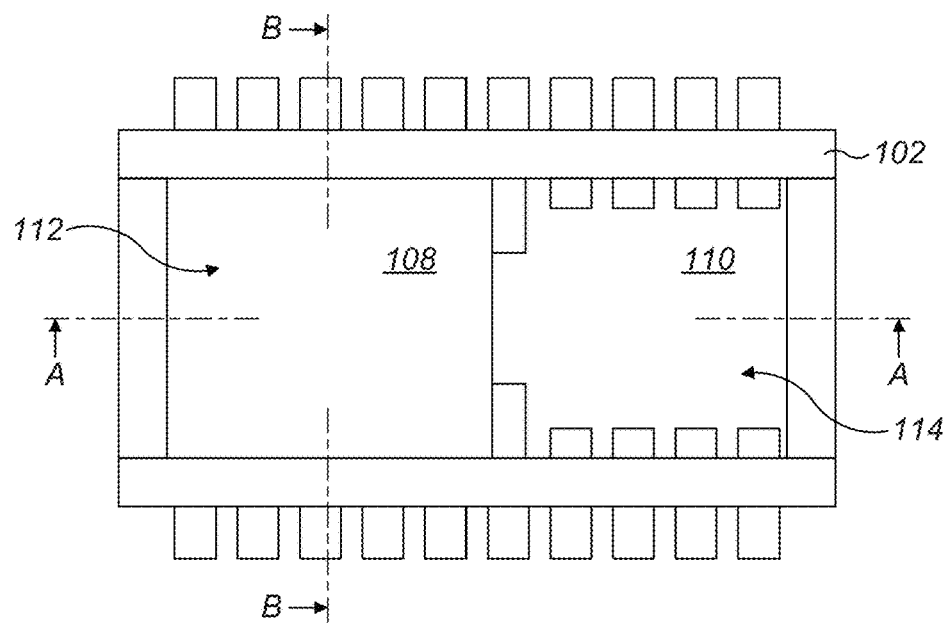
FIG. 5 is a schematic plan view of an unpopulated lead frame package of FIG. 1.
Figure 6:
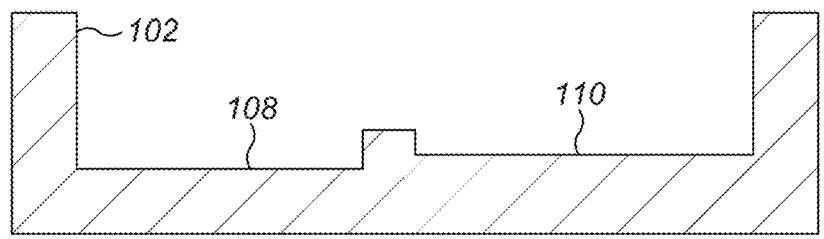
FIG. 6 is a schematic cross section along line A-A of the lead frame package of FIG. 5.
Figure 7:
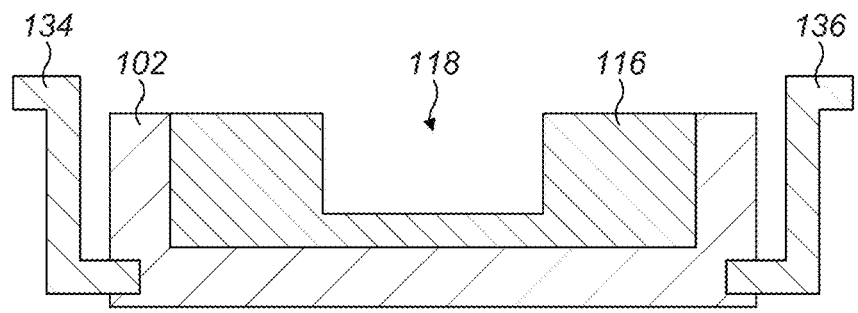
FIG. 7 is a schematic cross section along line B-B of the lead frame package of FIG. 5.

Referring to FIG. 4, the sensor device 100 is constructed as follows. The premoulded lead frame 102 (FIGS. 5, 6 and 7) is taken in an unpopulated state (Step 200), the first cavity 112 having the first base 108, which is empty, and the second cavity 114 having the second base 110, which is also empty. The partition wall 116 has the cut-out 118, which is also clear for receiving the pressure sensor element 120.

Figure 8:
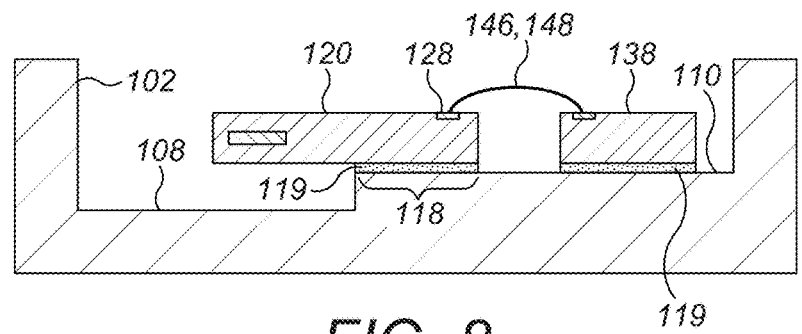
FIG. 8 is a schematic cross section along line A-A of the lead frame package of FIG. 5 populated with a sensor element and a circuit.
Figure 9:
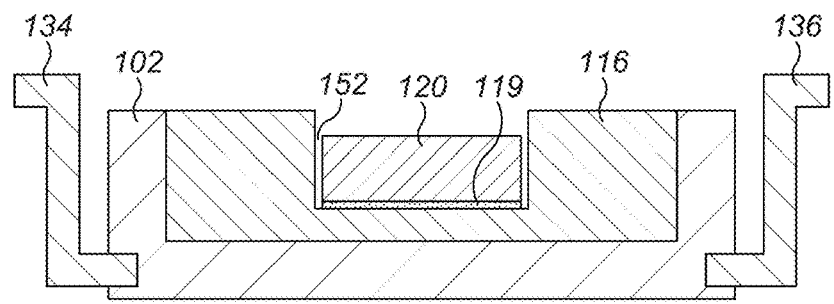
FIG. 9 is a schematic cross section along line B-B of the lead frame package of FIG. 5 populated with a sensor element and a circuit.
Figure 10:
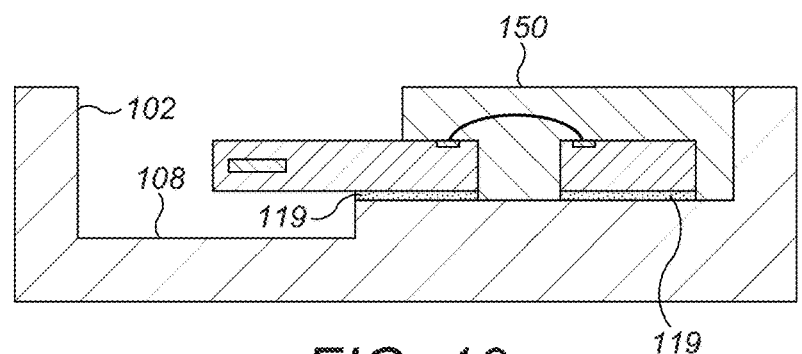
FIG. 10 is a schematic cross section along line A-A of the lead frame package of FIG. 5 populated as in FIG. 8 after application of an encapsulant and constituting a further embodiment of the invention.
Figure 11:
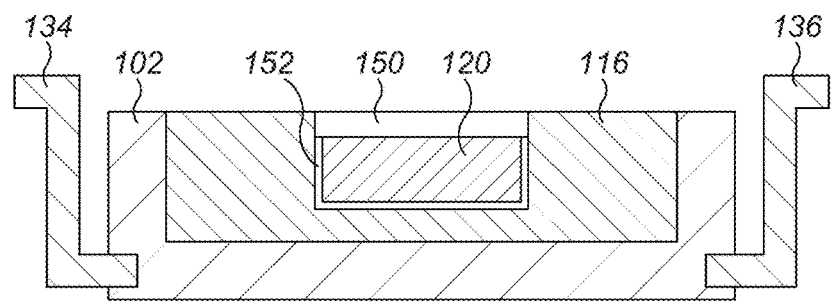
FIG. 11 is a schematic cross section along line B-B of the lead frame package of FIG. 5 populated as in FIG. 9 after application of the encapsulant.

Turning to FIGS. 8 and 9, an adhesive 119 is applied (Step 202) to the site where the pressure sensor element 120 is to be deposited, for example in the cut-out 118, and the site where the driver IC 138 is to be deposited. The pressure sensor element 120 is then positioned (Step 204) in contact with the adhesive 119 in the lead frame package 102 so that the majority of the pressure sensor element 120 is suspended in the first cavity 112 and the remainder of the pressure sensor element 120 overlies the cut-out 118 in the partition wall 116 and sufficiently into the second cavity 114 so that the first bond pads 128 are in the second cavity 114. The driver IC 138 is also positioned (Step 206) in contact with the adhesive 119 in the second cavity 114. The first bond pads 128 of the pressure sensor element 120, the second bond pads 140 of the driver IC 138 and the inner lead contact terminals 142, 144 are interconnected (Step 208) using bond wires 146, 148 according to how the pressure sensor element 120, the driver IC 138 and the lead frame need to be interconnected to satisfy the circuit design of the sensor device 100. This is optional depending upon whether anything is disposed in the second cavity 114 to which connection is required. Thereafter, and referring to FIG. 11, the encapsulant material 150 is deposited (Step 210) in the second cavity 114, constituting a glob top, so as to encapsulate the second end 124 of the pressure sensor element 120, the driver IC 138 and the wire bonding 146, 148. The viscosity of the encapsulant material is selected to avoid leakage of the encapsulant material 150 into the first cavity 112 via the cut-out 118 in the partition wall 116.

There completed pressure sensor device 100 can then be used for various applications, for example in relation to vehicular applications, such as automotive applications. The completed pressure sensor device 100 can be brought into contact with and sealingly fixed to, for example, an access port to provide fluid communication between the sensor device 100 and a fluid the pressure of which is to be measured. The access port can be provided in any fluid system where fluid pressure is to be measured. In this regard, by virtue of the pressure sensor element 120 in the first cavity 112 being exposed, the pressure sensor element 120 is in fluid communication with fluid to be measured.

The skilled person should appreciate that the above-described implementations are merely examples of the various implementations that are conceivable within the scope of the appended claims. Indeed, it should be appreciated that in the examples described above, the volume of the first die-receiving subframe is closed at one end to form the first cavity 110. However, in other embodiment, the first base 108 can be absent or the first base 108 can comprise an aperture so that the volume of the first die-receiving subframe 104 is accessible from both sides of the lead frame package 102. In this regard, it can be seen that upper and lower surfaces of the pressure sensor element are, irrespective of orientation, exposed to ambient. It should also be appreciated that the apertures are not formed in upper and lower layers of surface material, but are instead simply openings in the lead frame package 102, i.e. the apertures can have substantially the same surface area as the footprint of the first cavity 112.

In another embodiment, the pressure sensor device 100 can be formed so that the pressure sensor element 120 can be arranged to reside substantially in the first cavity 110 and extend into the partition wall 116. In this respect, the second end 124 of the pressure sensor element 120 extends into the cut-out 118 in the partition wall 116, but does not impinge on the second cavity 112. Any device disposed in the second cavity 112 can be electrically connected to the bond pads 128 at the second end 124 of the pressure sensor element 120, which would reside in the cut-out 118 of the partition wall 116, prior to encapsulation. In this regard, the cut-out 118 into which the second end 124 of the pressure sensor element 120 extends is filled with, for example, a high-viscosity material that impedes progress of the encapsulant from the second cavity 124 into the first cavity 110. The encapsulant can then be, for example, "snap cured" using light, such as ultra-violet light, or heat, in order to prevent overflow of the encapsulant.

The invention claimed is:

1. A method of manufacturing a sensor device, the method comprising:
   providing a package having a first die-receiving subframe defining a first volume separated by a partition wall of the package from a second die-receiving subframe defining a second volume;
   disposing an elongate sensor element within the package, the elongate sensor element having a sensing region at a first end thereof and a second end distal from the first end, and the elongate sensor element extending from within the first volume so that the second end of the elongate sensor element extends into the partition wall, the elongate sensor element residing substantially in the first volume; and
   dispensing an encapsulant material into the second volume after disposing the elongate sensor element within the package, the encapsulant material being impeded from progressing into the first volume.

2. The method according to claim 1, further comprising: disposing the elongate sensor element so as to bridge the first and second volumes, thereby extending through the partition wall so as to reside partially in the second volume.

3. The method according to claim 1, further comprising: providing an electrical contact at the second end of the elongate sensor element.

4. The method according to claim 3, wherein the second end of the elongate sensor element extends sufficiently into the second volume so that at least part of the electrical contact is accessible for connection within the second volume.

5. The method according to claim 1, further comprising: disposing a circuit in the second volume.

6. The method according to claim 5, further comprising: fixedly siting the circuit in the second volume by adhesion.

7. The method according to claim 5, further comprising: electrically coupling the circuit to the elongate sensor element.

8. The method according to claim 5, further comprising: providing wire bonding between the circuit and the elongate sensor element.

9. The method according to claim 5, wherein the package comprises an internal lead contact terminal, and the circuit is a driver integrated circuit; and the method further comprises:
wire bonding the driver integrated circuit to the elongate sensor element and to the internal lead contact terminal of the package.

10. The method according to claim 1, further comprising: electrically connecting the elongate sensor element within the second volume.

11. The method according to claim 1, wherein the second end of the elongate sensor element protrudes into the second volume; and the method further comprises:
enveloping the second end of the elongate sensor element with the encapsulant material.

12. The method according to claim 11, further comprising:
forming a glob top with the encapsulant material.

13. The method according to claim 1, further comprising: providing the elongate sensor element so as to comprise a membrane located in the first volume.

14. The method according to claim 1, further comprising: providing the first and second volumes as first and second cavities, respectively.

15. The method according to claim 14, further comprising:
providing the first and second cavities in stepped relation with respect to each other.

16. The method according to claim 14, further comprising:
forming the first and second cavities so that the first cavity is deeper than the second cavity.

17. The method according to claim 1, wherein the elongate sensor element comprises an upper surface and a lower surface; and the method further comprises:
providing the second volume as a cavity; and
configuring the first volume so that the upper and lower surfaces of the elongate sensor element are exposed to ambient.

18. The method according to claim 1, further comprising: forming the elongate sensor element as a pressure sensor.

* * * * *